(12) United States Patent
Fernandez

(10) Patent No.: US 6,259,032 B1
(45) Date of Patent: Jul. 10, 2001

(54) CIRCUIT BOARD GROUNDING SCHEME

(75) Inventor: Luis Fernandez, Santa Rosa, CA (US)

(73) Assignee: Agilent Technologies Inc., Palo Alto, CA (US)

(*) Notice: Subject to any disclaimer, the term of this patent is extended or adjusted under 35 U.S.C. 154(b) by 0 days.

(21) Appl. No.: 09/321,985

(22) Filed: May 28, 1999

(51) Int. Cl.[7] .................................................. H01B 17/02
(52) U.S. Cl. ................................ 174/138 E; 174/166 S; 361/742
(58) Field of Search ........................... 174/138 D, 138 E, 174/138 G, 135, 166 S; 361/742, 758, 770, 804, 807, 808, 810

(56) References Cited

U.S. PATENT DOCUMENTS

| | | | |
|---|---|---|---|
| D. 293,880 | * | 1/1988 | Takahashi ........................ D8/354 |
| 3,029,486 | * | 4/1962 | Raymond ........................... 24/73 |
| 3,093,874 | * | 6/1963 | Rapata ............................. 24/73 |
| 3,688,635 | * | 9/1972 | Fegen ............................. 85/5 R |
| 4,629,356 | * | 12/1986 | Hayashi ......................... 403/408.1 |
| 4,726,722 | * | 2/1988 | Wollar ............................ 411/32 |
| 4,965,699 | * | 10/1990 | Jorden et al. .................... 361/387 |
| 5,223,674 | * | 6/1993 | Reznikov ........................ 174/138 D |
| 5,790,377 | * | 8/1998 | Schreiber et al. ................. 361/704 |
| 6,129,948 | * | 10/2000 | Plummer et al. .................. 427/202 |

* cited by examiner

Primary Examiner—Dean A. Reichard
Assistant Examiner—Adolfo Nino
(74) Attorney, Agent, or Firm—John L. Imperato

(57) ABSTRACT

A circuit board grounding scheme has a series of slots that are self-aligning with a series of conductive standoffs. Each standoff has a tapered head supported by a neck and a base that is coupled to a conductive member. A narrow portion of the tapered head of each standoff penetrates a corresponding one of the slots in the circuit board, aligning the circuit board with the standoffs. Once aligned with the standoffs, the circuit board rests on the bases of the standoffs in a neutral position. The circuit board is then biased toward the necks of the standoffs, becoming wedged in a non-uniform gap that is formed between a wide end of the tapered head and the base of each standoff. One or more ground areas on the circuit board contacts the wide end of the tapered head or the base of the standoff. The standoffs are coupled to the conductive member using fasteners, or the standoffs are compression fit into the conductive member. Alternatively, the standoffs are formed to be continuous with the conductive member.

19 Claims, 3 Drawing Sheets

CIRCUIT BOARD GROUNDING SCHEME

BACKGROUND OF THE INVENTION

The performance of electronic instruments often depends on how well the circuit boards within the instruments are grounded to the instruments' chassis. For example, in a measurement instrument poorly grounded circuit boards can increase noise and spurious signal levels, degrading measurement range and accuracy of the instrument. Typically, circuit boards are grounded using a series of conductive standoffs, which also provide mechanical support for the circuit boards in the instrument. In one known grounding scheme, one end of each standoff is fastened to the instrument chassis while the other end of the standoff contacts a ground plane of the circuit board and receives a fastening screw. The fastening screws ensure both adequate mechanical support for the circuit board and sufficient grounding of the circuit board to the instrument's chassis. However, the screws increase the assembly time for this type of grounding scheme because the circuit board must be accurately aligned with the series of standoffs before each of the screws is properly positioned and installed. Another known grounding scheme provides self-alignment of the circuit board with the standoffs and does not rely on screws to fasten the circuit board to the standoff. While this scheme has low assembly time, it does not provide for intimate grounding of the circuit board to the instrument chassis. The grounding provided may be inadequate for electronic instruments in which performance depends on well-grounded circuit boards. Accordingly, there is a need for a grounding scheme that achieves intimate grounding of a circuit board to an instrument chassis, that also has low assembly time.

SUMMARY OF THE INVENTION

In a grounding scheme constructed according to the preferred embodiments of the present invention, a circuit board having a series of slots is self-aligning with a series of conductive standoffs. Each standoff has a tapered head supported by a neck, and a base that is coupled to a conductive member, such as an instrument chassis. A narrow portion of the tapered head of each standoff penetrates a corresponding one of the slots in the circuit board, aligning the circuit board with the standoff. Once aligned with the standoffs, the circuit board rests on the bases of the standoffs in a neutral position. The circuit board is then biased toward the necks of the standoffs, becoming wedged in a non-uniform gap that is formed between a wide end of the tapered head and the base of each standoff. One or more ground areas on the circuit board contacts the wide end of the tapered head or the base of the standoff. According to a first preferred embodiment of the present invention, the standoffs are coupled to the conductive member using fasteners, or alternatively, the standoffs are compression fit into the conductive member. According to a second preferred embodiment of the present invention, the standoffs are continuous with the conductive member.

DETAILED DESCRIPTION OF THE PREFERRED EMBODIMENT

Figure 1A:
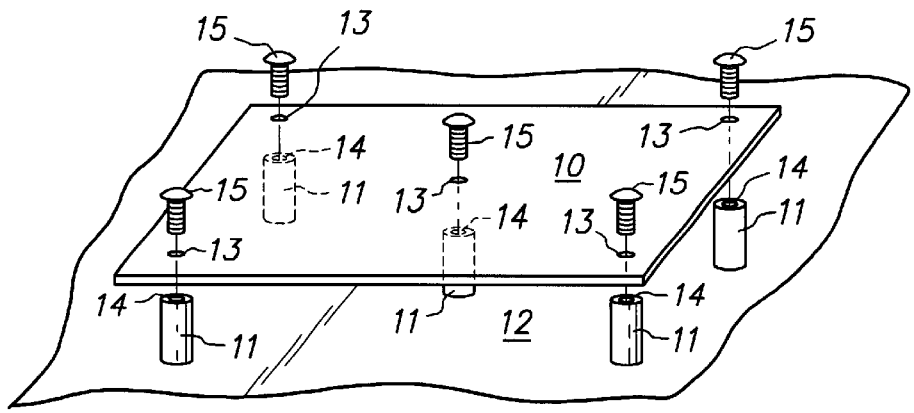
FIGS. 1A and 1B show a first prior art grounding scheme for a circuit board.
Figure 1B:
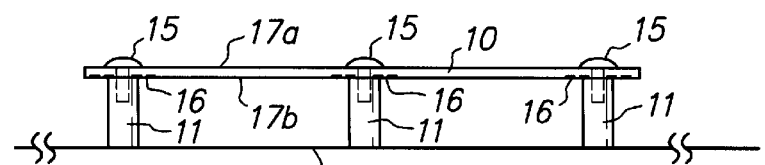

FIGS. 1A and 1B show a first prior art grounding scheme for a circuit board 10. The circuit board 10 is mounted on a series of conductive standoffs 11 which are fastened to a conductive member 12, such as an instrument chassis. The circuit board 10 has a series of holes 13 that are positioned to align with the series of standoffs 11 as fastened to the conductive member 12. Each standoff 11 has a threaded bore 14 for receiving a screw 15. When the holes 13 of circuit board 10 are aligned with the series of standoffs 11, the screws 15 are properly positioned so they can be installed into the threaded bores 14. Ground traces 16 on the circuit board are proximate to the holes 13 on either, or both, of the top side 17a of the circuit board 10 and the bottom side 17b (as shown) of the circuit board 10 so that intimate grounding of the circuit board 10 to the standoffs 11 and the conductive member 12 is achieved. However, the alignment of the circuit board 20, and the positioning and installation of the screws 15 causes this prior art grounding scheme to have high assembly time.

Figure 2A:
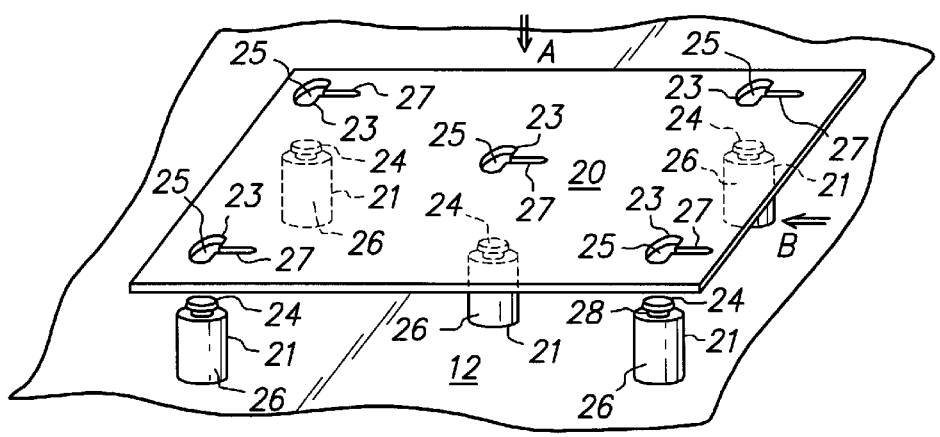
FIGS. 2A and 2B show a second prior art grounding scheme for a circuit board.
Figure 2B:
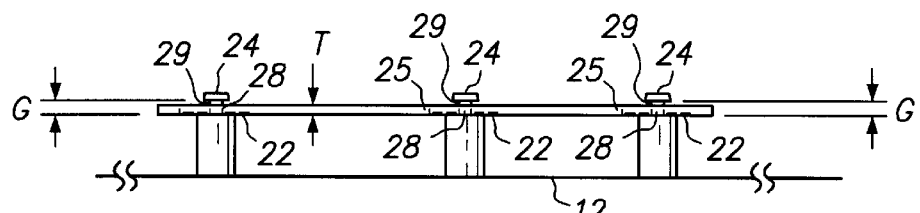

FIGS. 2A and 2B show a second prior art grounding scheme for a circuit board 20. The circuit board 20 is mounted on a series of conductive standoffs 21, such as PEM brand self-clinching standoffs, available from Penn Engineering and Manufacturing Corp., Dandoro, Pa. The standoffs 21 are fastened to a conductive member 12, such as an instrument chassis. The circuit board 20 has a series of keyhole-shaped slots 23 that are positioned so that a body portion 25 of each of the slots 23 aligns with the series of standoffs 21 as fastened to the conductive member 12. Alignment of the circuit board 20 and the slots 23 is readily achieved since a head 24 of each standoff 21 is smaller than the body portion 25 of the slots 23. The circuit board 20 is placed in a neutral position by lowering the circuit board 20 (in a direction indicated by arrow A) onto a base 26 of each of the standoffs 21. The circuit board 20 is then biased from the neutral position by moving the circuit board 20 (in the direction indicated by arrow B) so that an end of an elongated portion 27 of each of the slots 23 becomes adjacent to a neck 28 of each of the standoffs 21. The circuit board 20 is maintained in the biased position by a screw or other type of fastener (not shown).

The standoff 21 used in this second prior art grounding scheme has a gap 29 of uniform thickness between the head 24 and base 26. Manufacturing tolerances effect the thickness of the gap 29 and the thickness of the circuit board 20 so in order to ensure that the position of the circuit board 20 on the standoffs 21 can be biased from the neutral position while the elongated portion 27 is maintained within the gap 29 between the head 24 and base 26, the thickness G of the gap 29 is chosen to exceed the thickness T of the circuit board 20. Because of the relative thicknesses of the gap 29 and the circuit board 20, there is no forced contact between the ground traces 22 on the circuit board 20. The circuit board 20 is free to move between the head 24 and base 26 of the standoff 21 within the gap 29 and an intimate grounding of the ground traces 22 to the head 24 or base 26 is not ensured. This grounding scheme may be inadequate for electronic instruments having performance that relies on intimate grounding between the circuit board 20 and the instruments' chassis 12.

Figure 3A:
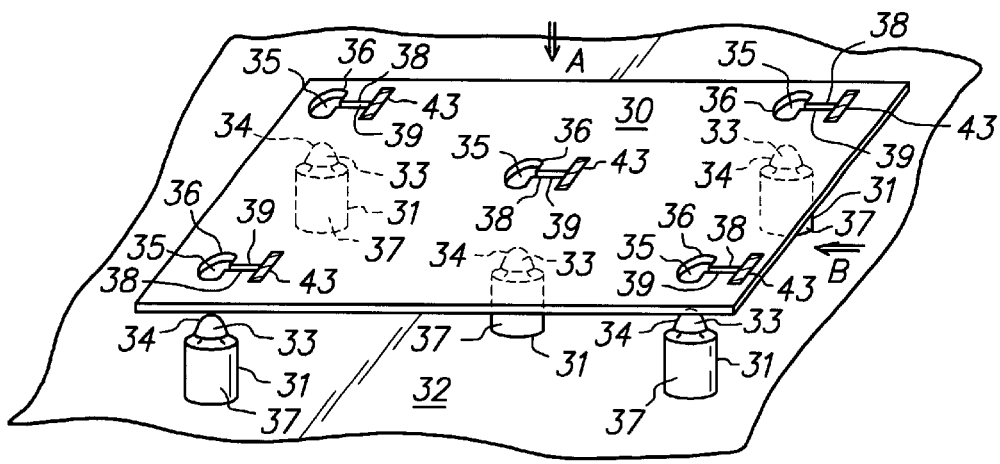
FIGS. 3A–3C show a grounding scheme for a circuit board constructed according to a first preferred embodiment of the present invention.
Figure 3B:
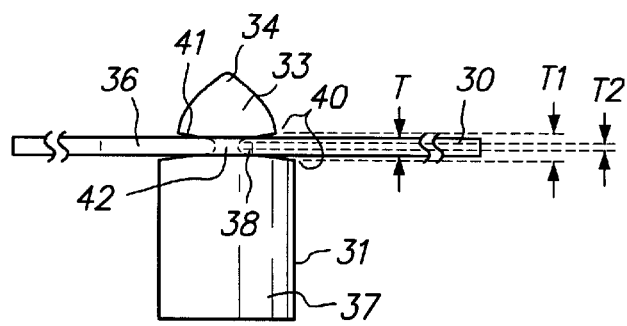
Figure 3C:
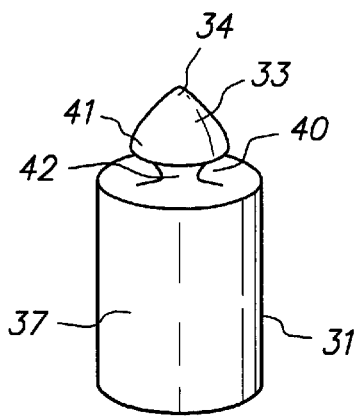

FIGS. 3A–3C show a grounding scheme for a circuit board 30 constructed according to a first preferred embodiment of the present invention. As shown in FIG. 3A, the circuit board 30 is mounted on a series of standoffs 31 that at one end are fastened to a conductive member 32, such as an instrument chassis. For example, the fastening can be achieved using a screw received by a threaded bore (not shown) in a base 37 of the standoff 31, or the base 37 can have a threaded end that is received by a threaded bore in the conductive member 32 (not shown). Alternatively the base 37 can be compression fitted into the conductive member 32.

Each standoff 31 has a tapered head 33 having a narrow end 34 at the end of the standoff 31 opposite to the end of the standoff 31 that is coupled to the conductive member 32. The tapered head 33 of each standoff 31 may have a linear profile, or a nonlinear profile as shown in FIGS. 3A–3C. The tapered heads 33 provide for easy alignment between slots 36 and the standoffs 31 since the narrow end 34 of each of the tapered heads 33 is substantially smaller than a body portion 35 of each of the keyhole slots 36 and can readily penetrate a body portion 35 of a corresponding keyhole slot 36 in the circuit board 30. A series of keyhole slots 36 in the circuit board 30 are positioned to correspond with the series of standoffs 31.

To install the circuit board 30 according to the grounding scheme of the first preferred embodiment of the present invention, the circuit board 30 is first positioned above the series of standoffs 31, with the narrow ends 34 of the tapered heads 33 being sufficiently aligned with the body portions of the keyhole slots 36 to enable the narrow ends 34 of the tapered heads 33 to penetrate the body portions 35 of the slots 36. The circuit board 30 is then moved toward the standoffs 31 (in a direction indicated by arrow A). The circuit board 30 is in a neutral position when the tapered heads 33 protrude through the slots 36 and the circuit board 30 is supported by the bases 37 of the standoffs 31. While the tapered heads 33 are small enough to easily fit within the body portions of the slots 36, each base 37 is bigger than each corresponding slot 36 so that the circuit board is prevented from sliding past the base 37 toward the conductive member 32. The circuit board 30 is then biased from the neutral position by moving the circuit board 30 (in the direction indicated by arrow B) so that an end 38 of an elongated portion 39 of each of the slots 36 becomes adjacent to a neck 42 of each of the standoffs 31.

The standoff 31 has a gap 40 of varying thickness between the bottom, or wide end 41, of the tapered head 33 and the base 37. The thickness of the gap 40 decreases as the distance from the neck 42 decreases. Distal to the neck 42 the gap 40 has a thickness T1 that is greater than the thickness T of the circuit board 30. Proximal to the neck 42 the gap has a thickness T2 that is less than the thickness T of the circuit board 30. When the end 38 of the elongated portion of the keyhole slot 36 becomes adjacent to the neck 42 of the circuit board 30, the circuit board 30 becomes wedged in the gap 40 between the wide end 41 of the tapered head 33 and the base 37. By locating ground areas 43 on the top side, the bottom side, or both the top and bottom sides of the circuit board 30 at the end 38 of the elongated portion of the keyhole slot 36, contact between the ground area 43 and the standoff 31 is ensured. By forming the standoff from metal, or by coating the standoff 31 with conductive material, intimate grounding of the ground areas 43 of the circuit board 30 to the conductive member 32 is achieved.

The thicknesses T1 and T2 of the gap 40 and the transitions between the gap thicknesses T1, T2 are adjusted according to the thickness T of the circuit board 30 to achieve a sufficient compression of the circuit board 30, deformation of the standoff 31, or contact force between the wide end of the tapered head and the base to ensure intimate grounding between the circuit board 30 and the conductive member 32.

Once the circuit board 30 is wedged between the wide end and the base as a result of biasing the circuit board 30 toward the neck, the position of the circuit board is maintained with a screw or other type of fastener (not shown).

Figure 3D:
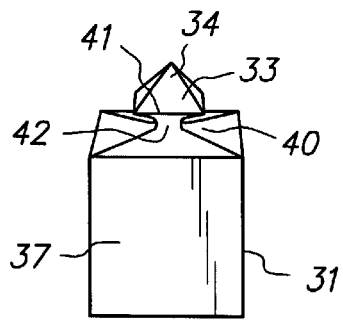
FIG. 3D shows a rectangular or square standoff.

FIG. 3C shows a standoff 31 that is radially symmetric and has a round cross-section and FIG. 3D shows a standoff 31 that has a rectangular or square cross-section. Other cross-sectional shapes for the standoffs 31 are alternatively used.

Figure 4A:
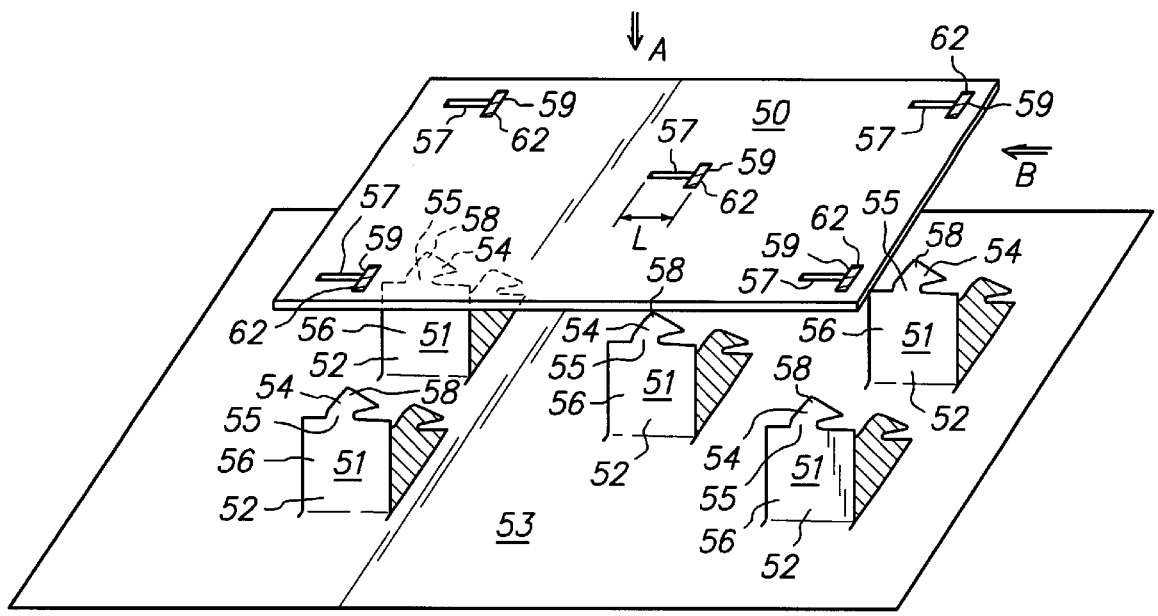
FIGS. 4A and 4B show a grounding scheme for a circuit board constructed according to a second preferred embodiment of the present invention.
Figure 4B:
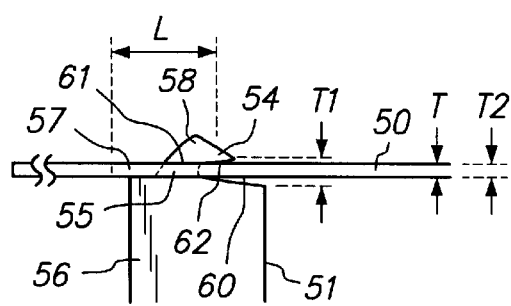

FIGS. 4A and 4B show a grounding scheme for a circuit board 50 constructed according to a second preferred embodiment of the present invention. As shown in FIG. 4A, the circuit board 50 is mounted on a series of standoffs 51 that at one end 52 are continuous with a conductive member 53, such as a sheetmetal component of an instrument chassis. Each of the standoffs 51 is formed by cutting or punching the shape of the standoff 51, including a tapered head 54, neck 55 and base 56, from the conductive member 53 and then bending the standoff 51 at the base 56. Bending the standoffs 51 at the base 56 orients the standoffs 51 orthogonal to the conductive member 53.

The tapered head 54 of each standoff 51 has either a linear profile, or a nonlinear profile (as shown). The tapered heads 54 provide for easy alignment of the standoffs 51 in corresponding rectangular slots 57 within the circuit board 50, since a narrow end 58 of each of the tapered heads 54 is substantially shorter than the length L of each of the rectangular slots 57 and can readily penetrate the rectangular slots 57 in the circuit board 50. A series of rectangular slots 57 in the circuit board 50 are positioned to correspond with the series of standoffs 51.

To install the circuit board 50 according to the grounding scheme of the second preferred embodiment of the present invention, the circuit board 50 is first positioned above the series of standoffs 51, with the narrow ends 58 of the tapered heads 54 being sufficiently aligned with the rectangular slots 57 to enable the narrow ends 58 of the tapered heads 54 to penetrate the slots 57. The circuit board 50 is then moved toward the standoffs 51 (in a direction indicated by arrow A). The circuit board 50 is in a neutral position when the tapered heads 54 protrude through the slots 57 and the circuit board 50 is supported by the bases 56 of the standoffs 51. While the tapered heads 54 are narrow enough to readily fit within the of the slots 57, each base 56 is wider than the length L of the rectangular slots 57, so that the circuit board 50 is prevented from sliding past the base 56 and toward the conductive member 53. The circuit board 50 is then biased from the neutral position by moving the circuit board 50 (in the direction indicated by arrow B) so that an end 59 of the rectangular slots 57 becomes adjacent to the neck 54 of each of the standoffs 51.

The standoff 51 has a gap 60 of varying thickness between the bottom, or wide end 61, of the tapered head 54 and the base 56. The thickness of the gap 60 decreases as the distance from the neck 54 decreases. Distal to the neck 54 the gap 60 has a thickness T1 that is greater than the thickness T of the circuit board 50. Proximal to the neck 54 the gap has a thickness T2 that is less than the thickness T of the circuit board 50. When the end 59 of the rectangular slot 57 becomes adjacent to the neck 54 of the circuit board 50, the circuit board 50 becomes wedged in the gap 60 between the wide end 61 of the tapered head 54 and the base 56. By locating ground areas 62 on the top side, the bottom side, or both the top and bottom sides of the circuit board 50 at the end 59 of the rectangular slot 57, contact between the ground area 62 and the standoff 51 is ensured. By forming the standoff 51 from sheetmetal, or other conductive material, intimate grounding of the ground areas 62 of the circuit board 50 to the conductive member 53 is achieved.

The thicknesses T1 and T2 of the gap 60 and the transitions between the gap thicknesses T1, T2 are adjusted according to the thickness T of the circuit board 50 to achieve a sufficient compression of the circuit board 50, deformation of the standoff 51, or contact force between the wide end 61 of the tapered head 54 and the base 56 to ensure intimate grounding between the circuit board 50 and the conductive member 53.

Once the circuit board 50 is wedged between the wide end 61 and the base 56 as a result of biasing the circuit board 50 toward the neck 54, the position of the circuit board 50 is maintained with a screw or other type of fastener (not shown).

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A scheme for grounding a circuit board having a thickness to a conductive member, comprising:
   a circuit board having a series of slots and having at least one ground area proximate to each slot in the series; and
   a series of conductive standoffs aligned with the series of slots, each standoff including a tapered head having a narrow end at a first end of the standoff and having a wide end supported by a neck, the neck supported by a base coupled with the conductive member at a second end of the standoff, and each standoff including a gap between the wide end of the tapered head and the base, the gap decreasing in thickness from a first thickness greater than the thickness of the circuit board to a second thickness less than the thickness of the circuit board as proximity to the neck increases, the narrow end of the tapered head for penetrating a corresponding one of the slots in the series of slots of the circuit board so that the circuit board rests on the base in a neutral position, the circuit board becoming wedged between the wide end of the tapered head and the base when the circuit board is biased from the neutral position laterally within the gap toward the neck with the at least one ground area contacting at least one of the wide end of the tapered head and the base.

2. The scheme of claim 1 wherein each standoff in the series is radially symmetric about an axis orthogonal to the conductive member.

3. The scheme of claim 2 wherein the coupling to the conductive member is provided by a fastener.

4. The scheme of claim 2 wherein the coupling to the conductive member is provided by a compression fitting of the base into the conductive member.

5. The scheme of claim 2 wherein each slot has a keyhole shape with a circular body portion and an adjacent elongated portion having a length and a width, the at least one ground area positioned at an end of the elongated portion distal to the body portion, the diameter of the base of each standoff greater than the diameter of the circular body portion and greater than the width of the elongated portion, the diameter of the tapered head at the wide end less than diameter of the circular body portion and greater than the width of the elongated portion.

6. The scheme of claim 2 wherein the tapered head has a linear taper.

7. The scheme of claim 2 wherein the tapered head has a nonlinear taper.

8. The scheme of claim 2 wherein each conductive standoff is formed from metal.

9. The scheme of claim 2 wherein each conductive standoff includes a conductive coating.

10. The scheme of claim 1 wherein each standoff has a rectangular cross-section with respect to an axis orthogonal to the conductive member.

11. The scheme of claim 10 wherein the coupling to the conductive member is provided by a fastener.

12. The scheme of claim 10 wherein the coupling to the conductive member is provided by a compression fitting of the base into the conductive member.

13. The scheme of claim 10 wherein each slot has a keyhole shape with a body portion and an adjacent elongated portion having a length and a width, the at least one ground area positioned at an end of the elongated portion distal to the body portion, the wide end of the tapered head greater than the width of the elongated portion.

14. The scheme of claim 10 wherein the tapered head has a linear taper.

15. The scheme of claim 10 wherein the tapered head has a nonlinear taper.

16. The scheme of claim 10 wherein each conductive standoff is formed from metal.

17. The scheme of claim 10 wherein each conductive standoff includes a conductive coating.

18. The scheme of claim 1 wherein the conductive member and the series of standoffs are sheetmetal and the base is continuous with the conductive member.

19. The scheme of claim 18 wherein each slot has a rectangular shape, the length of the rectangle and the width of the rectangle each less than the width of the base, and the length of the rectangle greater than the wide end of the tapered head.

* * * * *